(12) United States Patent
Shih et al.

(10) Patent No.: US 7,615,910 B1
(45) Date of Patent: Nov. 10, 2009

(54) HIGH FREQUENCY SURFACE ACOUSTIC WAVE DEVICE

(75) Inventors: Wen-Ching Shih, Taipei (TW); Rui-Cheng Huang, Taipei (TW)

(73) Assignees: Tatung University, Taipei (TW); Tatung Company, Taipei (TW)

( * ) Notice: Subject to any disclaimer, the term of this patent is extended or adjusted under 35 U.S.C. 154(b) by 0 days.

(21) Appl. No.: 12/222,675

(22) Filed: Aug. 14, 2008

(30) Foreign Application Priority Data

Jul. 9, 2008 (TW) .............................. 97125872 A

(51) Int. Cl.
*H01L 41/08* (2006.01)
(52) U.S. Cl. .............................. 310/313 A; 310/313 R
(58) Field of Classification Search ............. 310/313 R, 310/313 A, 313 B
See application file for complete search history.

(56) References Cited

U.S. PATENT DOCUMENTS

| 3,965,444 | A | * | 6/1976 | Willingham et al. ........ 333/155 |
| 4,194,171 | A | * | 3/1980 | Jelks .......................... 333/149 |
| 4,243,960 | A | * | 1/1981 | White et al. ................. 333/196 |
| 4,342,012 | A | * | 7/1982 | Inaba et al. ................. 333/155 |
| 5,446,329 | A | * | 8/1995 | Nakahata et al. ........ 310/313 A |

* cited by examiner

*Primary Examiner*—Mark Budd
(74) *Attorney, Agent, or Firm*—Bacon & Thomas, PLLC

(57) ABSTRACT

The present invention relates to a high frequency surface acoustic wave device, which may be manufactured by the same manufacturing equipment, and with the same material, as those required for manufacturing a low frequency surface acoustic wave device. The disclosed high frequency surface acoustic wave device comprises: a piezoelectric substrate; a high acoustic velocity layer formed on the surface of the piezoelectric substrate whose acoustic velocity of the surface acoustic wave is larger than 5000 m/sec; an input transducing part; and an output transducing part; wherein the input transducing part and the output transducing part are formed in pair on or below the surface of the high acoustic velocity layer. Besides, the high acoustic velocity layer is preferably made of aluminum oxide, and formed on the surface of the piezoelectric substrate by an electron-beam evaporation process. The thickness thereof is preferably between 2 μm and 20 μm.

18 Claims, 4 Drawing Sheets

HIGH FREQUENCY SURFACE ACOUSTIC WAVE DEVICE

BACKGROUND OF THE INVENTION

1. Field of the Invention

The present invention relates to a high frequency surface acoustic wave device and, more particularly, to a high frequency surface acoustic wave device which may be manufactured by the same manufacturing equipment, and with the same material, as those required for manufacturing a low frequency surface acoustic wave device.

2. Description of Related Art

The surface acoustic wave device has been widely used as the middle-frequency filter of a TV. Besides, as the improvement in the material technology, the surface acoustic wave device can be used as a filter in the mobile communication field. Moreover, since the surface acoustic wave device has certain characteristics such as low loss level, high attenuation, small-size, and light-weight, the surface acoustic wave device is applied widely in the wireless communication field.

Since the surface acoustic wave device is widely applied in the communication products, which transmit or receive signals in a high frequency band, the demands on the high frequency surface acoustic wave device are thus increased dramatically. For the lithium niobate ($LiNbO_3$) substrate widely used in the surface acoustic wave device, the acoustic velocity of the surface acoustic wave thereof is 3295 m/s. Therefore, if the surface acoustic wave device is going to operate at 1800 MHz, the line widths of the surface acoustic wave filter must be as narrow as 0.5 μm or below. However, the contact-type lithography apparatus cannot be used in the manufacturing process with such high resolution. Instead, a stepper and an expensive dry-etching process must be used to manufacture such a high frequency surface acoustic wave device on the lithium niobate substrate. As a result, the cost of the manufacturing process is increased dramatically and not favorable for massive production process.

Furthermore, a manufacturing process including depositing a diamond layer or a diamond-like layer on a piezoelectric substrate, such as the lithium niobate substrate, the lithium titanate substrate, or the quartz substrate, is proposed. However, the roughness of the diamond film of the surface acoustic wave device manufactured by the above process is not suitable for the transmission of the surface acoustic wave. Therefore, a planarization process, such as the chemical mechanical planarization (CMP) process, is required. In other words, the proposed manufacturing process has lots of drawbacks, such as high cost, high technical threshold, and the requirement of a post-manufacturing process.

Other manufacturing processes have also been proposed, such as forming a high acoustic velocity layer on a low-cost silicon substrate having a piezoelectric layer thereon, but since the quality control on the piezoelectric layer is not as easily achieved as that of the piezoelectric substrate, so the manufacturing process cannot be employed in mass production yet. Besides, due to the peeling of the diamond-like layer, the surface acoustic wave device manufactured by depositing a diamond-like layer on a piezoelectric substrate is not stable enough for in-field operation.

Therefore, a peeling-free, low cost, easy to manufacture device having higher acoustic velocity, surface acoustic wave device is required in the communication industry.

SUMMARY OF THE INVENTION

The object of the present invention is to provide a high frequency surface acoustic wave device, which may be manufactured by the same manufacturing equipment, as the one required for manufacturing a low frequency surface acoustic wave device.

To achieve the object, the high frequency surface acoustic wave device of the present invention comprises: a piezoelectric substrate; a high acoustic velocity layer formed on the surface of the piezoelectric substrate, wherein the acoustic velocity of the surface acoustic wave of the high acoustic velocity layer is larger than 5000 m/sec; an input transducing part; and an output transducing part; wherein the input transducing part and the output transducing part are formed in pair on the surface of the high acoustic velocity layer.

Furthermore, the other kind of the high frequency surface acoustic wave device of the present invention comprises: a piezoelectric substrate; a high acoustic velocity layer formed on the surface of the piezoelectric substrate, wherein the acoustic velocity of the surface acoustic wave of the high acoustic velocity layer is larger than 5000 m/sec; an input transducing part; and an output transducing part; wherein the input transducing part and the output transducing part are formed in pair on the surface of the piezoelectric substrate, and the surface of the piezoelectric substrate located between the input transducing part and the output transducing part is covered by the high acoustic velocity layer.

Therefore, by having the high acoustic velocity layer which can improve the transmission of the surface acoustic wave, the line width of the input transducing part and the output transducing part of the high frequency surface acoustic wave device of the present invention is wider than that of the input transducing part and the output transducing part of a conventional high frequency surface acoustic wave device having the same operation frequency region. In other words, by having the same line width of the input transducing part and the output transducing part, the operation frequency region of the high frequency surface acoustic wave device of the present invention is higher than that of a conventional high frequency surface acoustic wave device. As a result, the high frequency surface acoustic wave device of the present invention can be manufactured by the lithography apparatus having ordinary resolution, and the requirement of a lithography apparatus having higher resolution in the manufacturing process is eliminated. Besides, the flexibility of the manufacturing process of the high frequency surface acoustic wave device of the present invention is higher, the complexity of the manufacturing process thereof is lowered, and the cost of the manufacturing process thereof is also minimized.

The piezoelectric substrate of the high frequency surface acoustic wave device of the present invention can be made of any kind of material, the piezoelectric substrate is preferably made of lithium niobate, quartz, lithium titanate, gallium arsenide, or langasite. The high acoustic velocity layer of the high frequency surface acoustic wave device of the present invention can be made of any kind of material having an acoustic velocity larger than 5000 m/sec, the high acoustic velocity layer is preferably made of aluminum oxide, polycrystalline diamond, micro-crystalline diamond, nano-diamond, or diamond-like carbon. The high acoustic velocity layer of the high frequency surface acoustic wave device of the present invention can have any thickness, the thickness of the high acoustic velocity layer is preferably between 2 μm and 20 μm. The high acoustic velocity layer of the high frequency surface acoustic wave device of the present invention can be formed on the surface of the piezoelectric substrate by any kind of process, it is preferably formed on surface of the piezoelectric substrate by an electron-beam evaporation process, an RF magnetron sputtering process, or a chemical vapor deposition process. The input transducing part and the output transducing part of the high frequency surface acoustic wave device of the present invention can be made of any kind of material, but preferably are made of aluminum.

Other objects, advantages, and novel features of the invention will become more apparent from the following detailed description when taken in conjunction with the accompanying drawings.

DETAILED DESCRIPTION OF THE PREFERRED EMBODIMENT

First Embodiment

Figure 1:
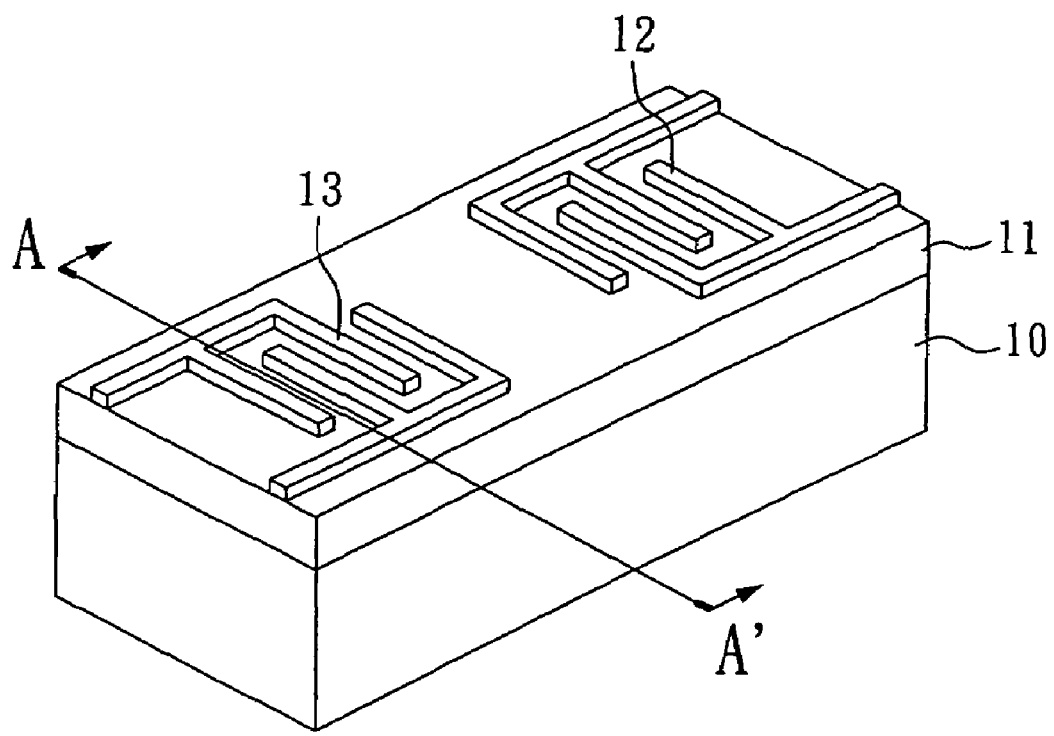
FIG. 1 is a perspective view of the high frequency surface acoustic wave device according to the first embodiment of the present invention.
Figure 2:
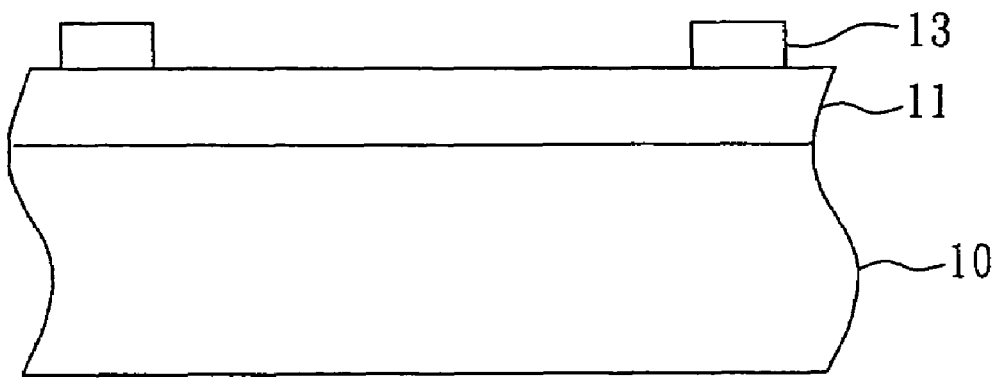
FIG. 2 is a cross sectional view taken along plane AA' of FIG. 1.

As shown in FIG. 1 and FIG. 2, the high frequency surface acoustic wave device according to the first embodiment of the present invention comprises a piezoelectric substrate 10, a high acoustic velocity layer 11, an input transducing part 12, and an output transducing part 13, wherein the acoustic velocity of the surface acoustic wave of the high acoustic velocity layer 11 is larger than 5000 m/sec. In the present embodiment, the high acoustic velocity layer 11 is made of aluminum oxide and formed on the surface of the piezoelectric substrate 10. On the other hand, the input transducing part 12 and the output transducing part 13 are each an interdigital transducer. Both of the input transducing part 12 and the output transducing part 13 are made of aluminum. The interdigital transducers are formed on the surface of the high acoustic velocity layer 11, and the line width of the interdigital transducers is between 0.5 μm and 5 μm.

The manufacturing process of the high frequency surface acoustic wave device according to the first embodiment of the present invention will be described below, with reference to FIG. 1 and FIG. 2.

First, a clean piezoelectric substrate 10 is provided. Then, an aluminum oxide layer having a thickness between 2 μm and 20 μm is formed on the surface of the piezoelectric substrate 10 by an electron-beam evaporation process, as the high acoustic velocity layer 11. The electron-beam evaporation process comprises the steps: positioning a piezoelectric substrate 10 into the reaction chamber of an electron-beam evaporation apparatus; and depositing an aluminum oxide layer on the surface of the piezoelectric substrate 10 with the following operation parameter:

(a) the background pressure is below $5\times10^{-5}$ Torr;
(b) the evaporation current is at 70 mA; and
(c) the substrate temperature of the piezoelectric substrate 10 is at 300° C.

By controlling the time of the deposition process, different thickness of the aluminum oxide layer can be obtained.

Next, after the high acoustic velocity layer 11 made of aluminum oxide is formed, a photoresist layer is formed on the surface of the aluminum oxide layer. After the execution of a lithography process, the pattern of the interdigital transducers is formed. Later, an aluminum layer having a thickness of 100 nm is formed on the photoresist layer having the pattern thereon. By executing a lift-off process to remove the unwanted aluminum layer, and a cleaning process of the photoresist layer, the input transducing part 12 and the output transducing part 13 are formed on the surface of the high acoustic velocity layer 11. At this time, the manufacturing process of the high frequency surface acoustic wave device according to the first embodiment of the present invention is completed.

Second Embodiment

Figure 3:
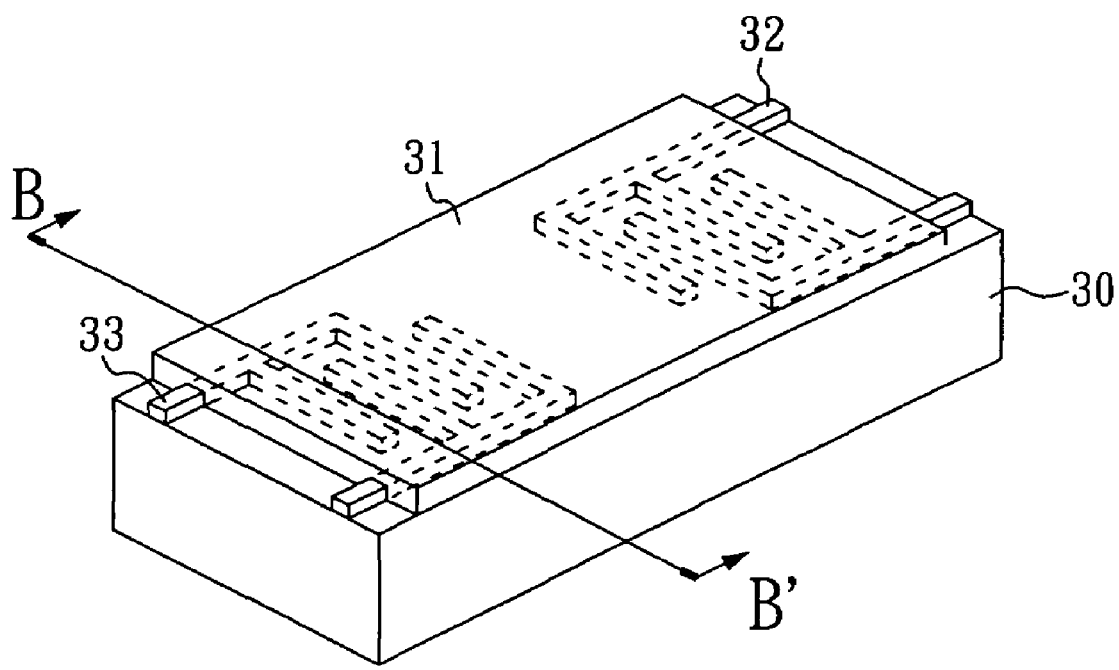
FIG. 3 is a perspective view of the high frequency surface acoustic wave device according to the second embodiment of the present invention.
Figure 4:
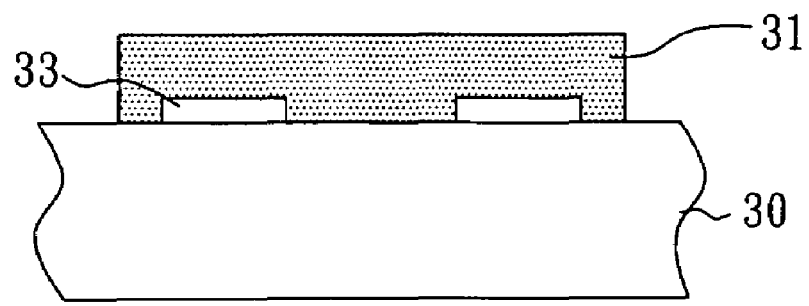
FIG. 4 is a cross sectional view taken along plane BB' of FIG. 3.

As shown in FIG. 3 and FIG. 4, the high frequency surface acoustic wave device according to the second embodiment of the present invention has a structure similar to that of the high frequency surface acoustic wave device according to the first embodiment of the present invention. The high frequency surface acoustic wave device according to the second embodiment of the present invention comprises a piezoelectric substrate 30, a high acoustic velocity layer 31, an input transducing part 32, and an output transducing part 33. However, in the present embodiment, the input transducing part 32 and the output transducing part 33, i.e. the interdigital transducers, are formed on the piezoelectric substrate 30. Besides, the high acoustic velocity layer 31 is formed on the input transducing part 32, the output transducing part 33, and the surface of the piezoelectric substrate 31 located between the input transducing part 32 and the output transducing part 33. Moreover, the line width of the input transducing part 32 and the output transducing part 33 is between 0.5 μm and 5 μm.

The manufacturing process of the high frequency surface acoustic wave device according to the second embodiment of the present invention will be described below, with reference to FIG. 3 and FIG. 4.

First, a clean piezoelectric substrate 30 is provided. Then, a photoresist layer is formed on the surface of the piezoelectric substrate 30. After the execution of a lithography process, the pattern of the interdigital transducers is formed. Later, an aluminum layer having a thickness of 100 nm is formed on the photoresist layer having the pattern thereon. By executing a lift-off process to remove the unwanted aluminum layer, and a cleaning process of the photoresist layer, the input transducing part 32 and the output transducing part 33 are formed on the surface of the piezoelectric substrate 30.

Next, an aluminum oxide layer having a thickness between 2 μm and 20 μm is formed by an electron-beam evaporation process, i.e., the high acoustic velocity layer 31. The electron-beam evaporation process comprises the steps: positioning a piezoelectric substrate 30 into the reaction chamber of an electron-beam evaporation apparatus; and depositing an aluminum oxide layer with the following operation parameter:

(a) the background pressure is below $5\times10^{-5}$ Torr;
(b) the evaporation current is at 70 mA; and
(c) the substrate temperature of the piezoelectric substrate 30 is at 300° C.

By controlling the time of the deposition process, different thickness of the aluminum oxide layer can be obtained. At this time, the manufacturing process of the high frequency surface acoustic wave device according to the second embodiment of the present invention is completed.

Figure 5:
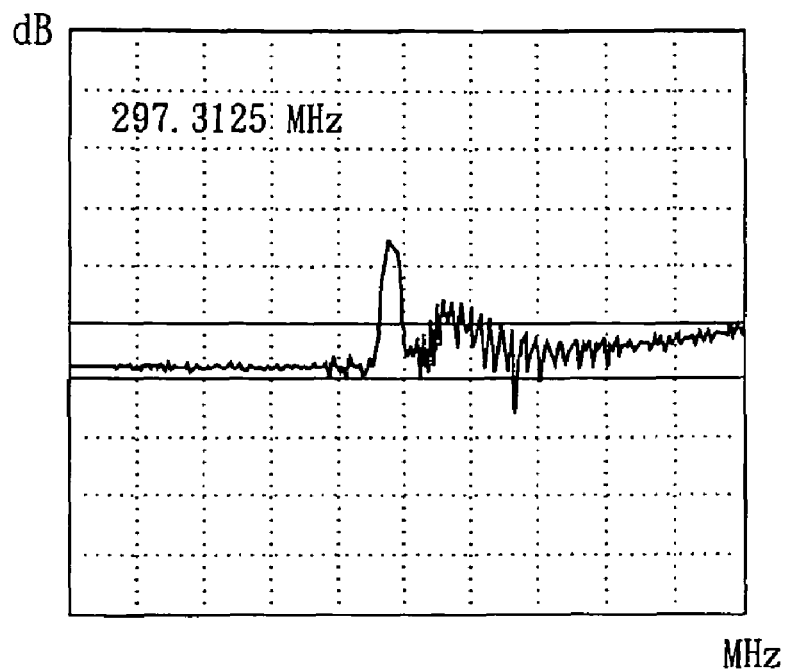
FIG. 5 shows the frequency response of the high frequency surface acoustic wave device according to the first embodiment of the present invention.
Figure 6:
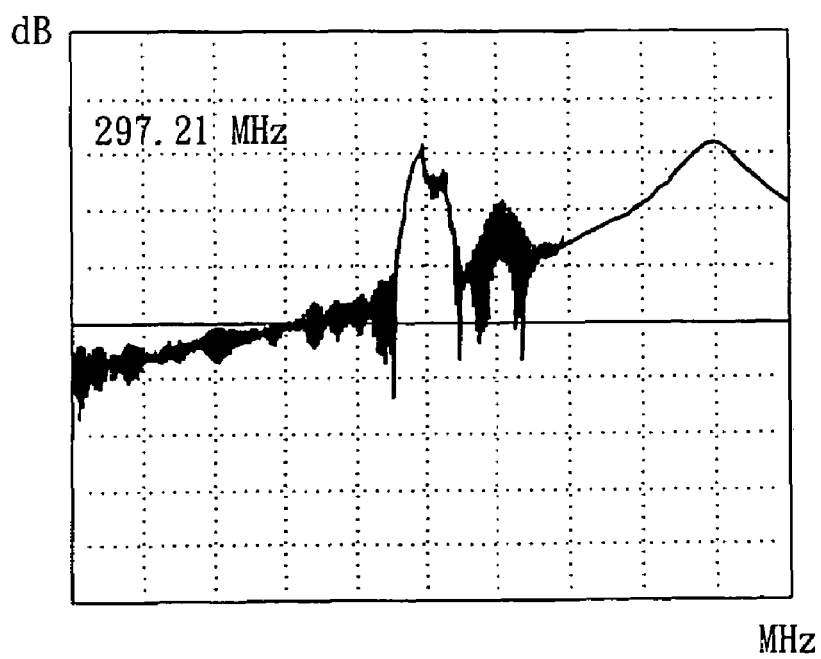
FIG. 6 shows the frequency response of the high frequency surface acoustic wave device according to the second embodiment of the present invention.
Figure 7:
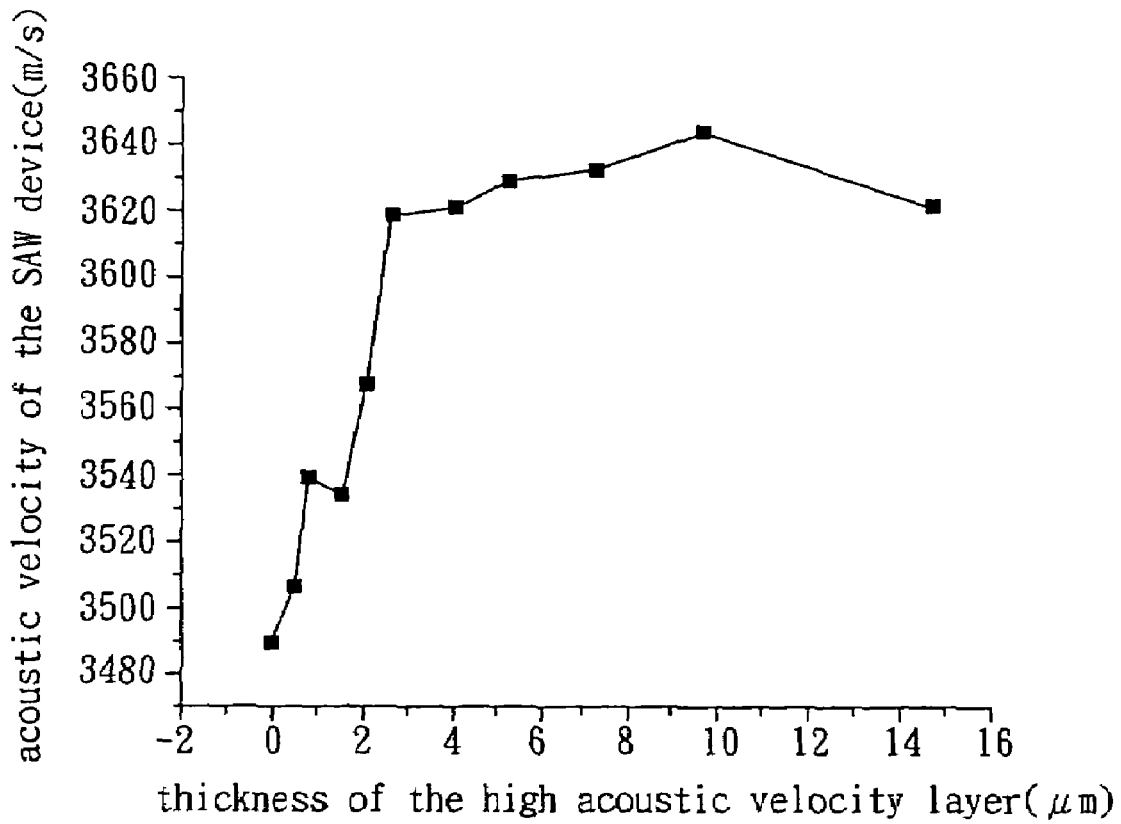
FIG. 7 shows the relation between the acoustic velocity of the surface acoustic wave device and the thickness of the high acoustic velocity layer of the high frequency surface acoustic wave device according to the first embodiment of the present invention.

The operation efficiency, such as the frequency response, of the high frequency surface acoustic wave device of the present invention is compatible with that of a conventional high frequency surface acoustic wave device, which will be proved in the following with reference to FIG. 5, FIG. 6, and FIG. 7. FIG. 5 shows the frequency response of the high frequency surface acoustic wave device according to the first embodiment of the present invention. FIG. 6 shows the frequency response of the high frequency surface acoustic wave device according to the second embodiment of the present invention. FIG. 7 shows the relation between the acoustic velocity of the surface acoustic wave and the thickness of the high acoustic velocity layer of the high frequency surface acoustic wave device according to the first embodiment of the present invention.

As shown in FIG. 5 and FIG. 6, during the frequency response measurement, the central frequency of the frequency response of the high frequency surface acoustic wave device according to the first embodiment (FIG. 5) and the central frequency of frequency response of the high frequency surface acoustic wave device according to the second embodiment (FIG. 6) both achieve 297 MHz, which is close to the central frequency of the frequency response of the conventional high frequency surface acoustic wave device having the interdigital transducers with the same line width. The central frequency of the frequency response of the conventional high frequency surface acoustic wave device is about 290 MHz. Therefore, the operation efficiency, especially the frequency response, of the high frequency surface acoustic wave device of the present invention is compatible with that of a conventional high frequency surface acoustic wave device.

Furthermore, as shown in FIG. 7, as the high acoustic velocity layer becomes thicker and thicker, the acoustic velocity of the surface acoustic wave of the high frequency surface acoustic wave device according to the first embodiment of the present invention is increased accordingly. Moreover, the aforementioned acoustic velocity is always higher than that of the surface acoustic wave of the conventional high frequency surface acoustic wave device having interdigital transducers with the same line width. The acoustic velocity of the surface acoustic wave of the conventional high frequency surface acoustic wave device is about 3489 m/s.

In conclusion, by having the high acoustic velocity layer which can improve the transmission of the surface acoustic wave, the line width of the input transducing part and the output transducing part of the high frequency surface acoustic wave device of the present invention is wider than that of the input transducing part and the output transducing part of a conventional high frequency surface acoustic wave device having the same operation frequency region. In other words, by having the same line width of the input transducing part and the output transducing part, the operation frequency region of the high frequency surface acoustic wave device of the present invention is higher than that of a conventional high frequency surface acoustic wave device. As a result, the high frequency surface acoustic wave device of the present invention can be manufactured by the lithography apparatus having ordinary resolution, the requirement of a lithography apparatus having higher resolution in the manufacturing process is eliminated. Besides, the flexibility of the manufacturing process of the high frequency surface acoustic wave device of the present invention is higher, the complexity of the manufacturing process thereof is lowered, and the cost of the manufacturing process thereof is also minimized.

Although the present invention has been explained in relation to its preferred embodiment, it is to be understood that many other possible modifications and variations can be made without departing from the scope of the invention as hereinafter claimed.

What is claimed is:

1. A high frequency surface acoustic wave device, comprising:
    a piezoelectric substrate;
    a high acoustic velocity layer formed on the surface of the piezoelectric substrate, wherein the acoustic velocity of the surface acoustic wave of the high acoustic velocity layer is larger than 5000 m/sec;
    an input transducing part; and
    an output transducing part;
    wherein the input transducing part and the output transducing part are formed in pair on the surface of the high acoustic velocity layer, and the high acoustic velocity layer is made of aluminum oxide.

2. The high frequency surface acoustic wave device as claimed in claim 1, wherein the piezoelectric substrate is made of lithium niobate, quartz, lithium titanate, gallium arsenide, or langasite.

3. The high frequency surface acoustic wave device as claimed in claim 1, wherein the thickness of the high acoustic velocity layer is between 2 μm and 20 μm.

4. The high frequency surface acoustic wave device as claimed in claim 1, wherein the high acoustic velocity layer is deposited on the surface of the piezoelectric substrate by an electron-beam evaporation process.

5. The high frequency surface acoustic wave device as claimed in claim 1, wherein the input transducing part and the output transducing part are each an interdigital transducer.

6. The high frequency surface acoustic wave device as claimed in claim 1, wherein the input transducing part and the output transducing part are made of aluminum.

7. A high frequency surface acoustic wave device, comprising:
    a piezoelectric substrate;
    a high acoustic velocity layer formed on the surface of the piezoelectric substrate, wherein the acoustic velocity of the high acoustic velocity layer is larger than 5000 m/sec;
    an input transducing part; and
    an output transducing part;
    wherein the input transducing part and the output transducing part are formed in pair on the surface of the piezoelectric substrate, and the surface of the piezoelectric substrate located between the input transducing part and the output transducing part is covered by the high acoustic velocity layer, and the high acoustic velocity layer is made of aluminum oxide.

8. The high frequency surface acoustic wave device as claimed in claim 7, wherein the piezoelectric substrate is made of lithium niobate, quartz, lithium titanate, gallium arsenide, or langasite.

9. The high frequency surface acoustic wave device as claimed in claim 7, wherein the thickness of the high acoustic velocity layer is between 2 μm and 20 μm.

10. The high frequency surface acoustic wave device as claimed in claim 7, wherein the high acoustic velocity layer is deposited on the surface of the piezoelectric substrate by an electron-beam evaporation process.

11. The high frequency surface acoustic wave device as claimed in claim 7, wherein at least a portion of the input transducing part is further covered by the high acoustic velocity layer.

12. The high frequency surface acoustic wave device as claimed in claim 7, wherein at least a portion of the output transducing part is further covered by the high acoustic velocity layer.

13. The high frequency surface acoustic wave device as claimed in claim 7, wherein the input transducing part and the output transducing part are each an interdigital transducer.

14. The high frequency surface acoustic wave device as claimed in claim 7, wherein the input transducing part and the output transducing part are made of aluminum.

15. The high frequency surface acoustic wave device as claimed in claim 5, wherein the line width of the interdigital transducers is between 0.5 μm and 5 μm.

16. The high frequency surface acoustic wave device as claimed in claim 13, wherein the line width of the interdigital transducers is between 0.5 μm and 5 μm.

17. The high frequency surface acoustic wave device as claimed in claim 4, wherein the electron-beam evaporation process comprises positioning the piezoelectric substrate into a reaction chamber and depositing the aluminum oxide layer on the surface of the piezoelectric substrate wherein a background pressure is below $5\times10^{-5}$ Torr, an evaporation current is at 70 mA, and the substrate temperature of the piezoelectric substrate is at 300° C.

18. The high frequency surface acoustic wave device as claimed in claim 10, wherein the electron-beam evaporation process comprises positioning the piezoelectric substrate into a reaction chamber and depositing the aluminum oxide layer on the surface of the piezoelectric substrate wherein a background pressure is below $5\times10^{-5}$ Torr, an evaporation current is at 70 mA, and the substrate temperature of the piezoelectric substrate is at 300° C.

* * * * *